United States Patent
Bernier et al.

[11] Patent Number: 5,998,812
[45] Date of Patent: *Dec. 7, 1999

[54] AMPLIFYING-GATE THYRISTOR WITH AN INCREASED HOLD CURRENT

[75] Inventors: Eric Bernier; Denis Berthiot, both of Tours, France

[73] Assignee: SGS-Thomson Microelectronics S.A., Saint Genis, France

[*] Notice: This patent is subject to a terminal disclaimer.

[21] Appl. No.: 09/008,854

[22] Filed: Jan. 19, 1998

Related U.S. Application Data

[63] Continuation of application No. 08/286,492, Aug. 4, 1994, Pat. No. 5,739,555.

[51] Int. Cl.[6] .................................................. H01C 29/74
[52] U.S. Cl. ....................... 257/157; 257/154; 257/158; 257/159; 257/160; 257/161; 257/164; 257/168; 257/52; 315/101; 315/105; 315/106; 315/107; 315/205
[58] Field of Search ................................... 257/157–160, 257/154, 52, 161, 164, 168; 315/105–107, 101, 205

[56] References Cited

U.S. PATENT DOCUMENTS

| | | |
|---|---|---|
| 3,942,070 | 3/1976 | Tomura et al. . |
| 4,083,063 | 4/1978 | Yu . |
| 4,177,478 | 12/1979 | Senes . |
| 4,503,359 | 3/1985 | Watanabe et al. ................. 315/105 |
| 4,629,944 | 12/1986 | Maytum et al. . |
| 4,673,844 | 6/1987 | Maytum et al. ................... 315/101 |
| 4,949,147 | 8/1990 | Bacuvier . |
| 4,956,690 | 9/1990 | Kato ................................. 257/157 |
| 5,739,555 | 4/1998 | Bernier et al. .................... 257/157 |

FOREIGN PATENT DOCUMENTS

| | | |
|---|---|---|
| 0249485 | 12/1987 | European Pat. Off. ........ H05B 41/04 |
| 0287856 | 10/1988 | European Pat. Off. . |

OTHER PUBLICATIONS

French Search Report from French Patent Application 93 09929, filed Aug. 6, 1993.
Patent Abstracts of Japan, vol. 6, No. 259 (E–149)(1137), Dec. 17, 1982 & JP–A–57157571

Primary Examiner—Fetsum Abraham
Attorney, Agent, or Firm—Wolf, Greenfield & Sacks, P.C.

[57] ABSTRACT

An amplifying-gate thyristor having an increased integrated circuit includes a main thyristor and an amplifying thyristor. The amplifying thyristor is of the gate turnoff-type. The main thyristor and the amplifying thyristor are such that the amplifying thyristor remains in the conductive state while the main thyristor is conductive. A control circuit turns off the amplifying thyristor when the current through the main thyristor is approximately its hold current.

5 Claims, 4 Drawing Sheets

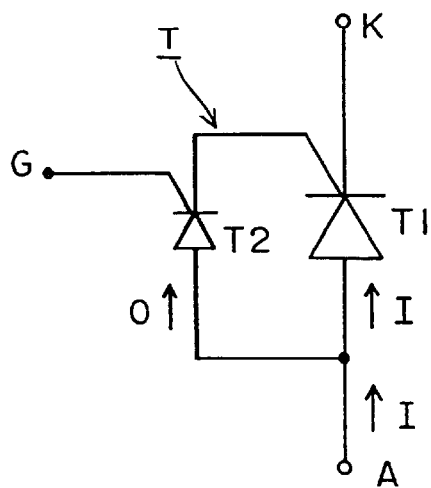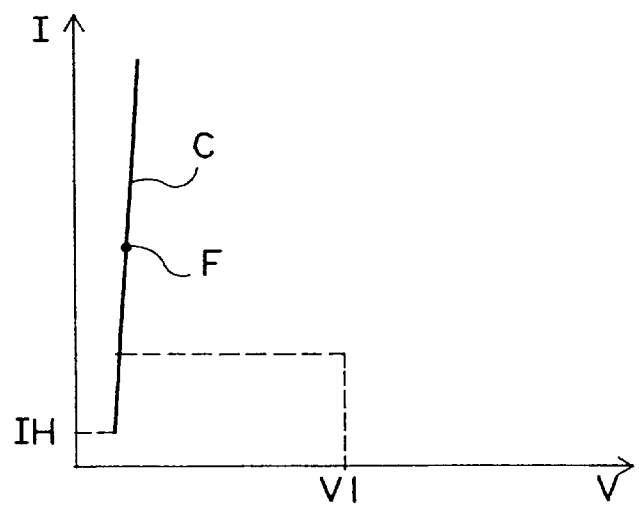
Fig 1A
Fig 1B
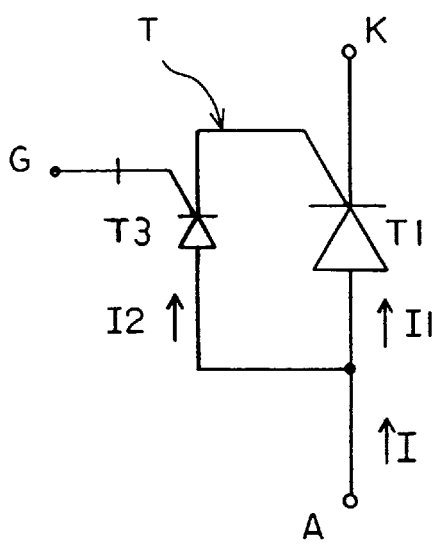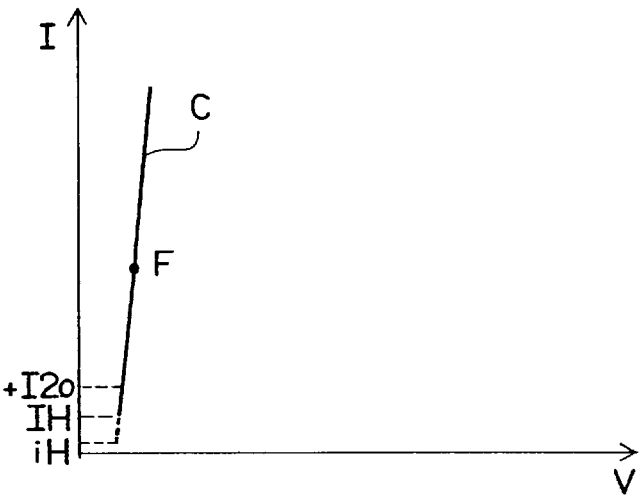
Fig 2A
Fig 2B

AMPLIFYING-GATE THYRISTOR WITH AN INCREASED HOLD CURRENT This application is a continuation of Ser. No. 08/286,492 filed Aug. 04, 1994 U.S. Pat. No. 5,739,555.

BACKGROUND OF THE INVENTION

1. Field of the Invention

The present invention relates to thyristor-type switches that can be set conductive when a voltage with a suitable polarity is present at their main terminals and when a pulse is applied to their gate, and that remain conductive as long as a voltage with a suitable polarity is applied to their main terminals. The present invention relates more particularly to amplifying-gate thyristors with high hold current which can be advantageously controlled by a low triggering current.

2. Discussion of the Related Art

FIG. 1A schematically represents a circuit for an amplifying-gate thyristor including a main thyristor T1 and amplifying thyristor T2. An anode A and a cathode K of the amplifying-gate thyristor correspond to the anode and to the cathode of the main thyristor T1. An amplifying thyristor T2 has its anode connected to anode A and its cathode connected to the gate of the main thyristor T1. The gate of thyristor T2 constitutes the control terminal G of the amplifying-gate thyristor T.

FIG. 1B shows the waveform of the current-voltage characteristic curve of an amplifying-gate thyristor (which also corresponds to a conventional thyristor).

When a voltage V1 is applied between the anode and cathode of a thyristor and a pulse is applied to gate G, the thyristor becomes conductive. First, the current I increases at a substantially constant voltage and, then, the voltage rapidly drops. The operating point F moves along a practically vertical curve C with a low voltage drop across the thyristor. For example, if the pulse applied to the gate is applied at the beginning of a positive half-period of a periodic signal, the current first increases, then decreases. When the operating point F reaches a minimum value corresponding to a hold current $I_H$, the thyristor reverts to its off state. A gate voltage must be applied again to the thyristor T to reset it to its conductive state. Thus, the thyristor T is conductive as long as the circuit is adapted to let a current higher than the hold current flow through the thyristor.

In some amplifying-gate thyristor applications, it is desired to have a high value for the hold current IH. The thyristor should cut off when the current decreases below a relatively high value.

In the state of the art, SGS-Thomson Microelectronics markets, under reference TN22, thyristors that are controlled by a 1.5 mA-gate current, have an avalanche voltage within a range of 1000–1600 volts and a hold current higher than 175 mA.

Among the features required in order to obtain a high hold current, the thyristor cathode must have a relatively high emitter shorting hole density. Therefore, it is possible, using conventional techniques, to design a thyristor T1 adapted to have a relatively high hold current. However, it is impossible to indefinitely increase the shorting hole density and accordingly the value of the hold current. Indeed, an increase in the shorting hole density corresponds in particular to an increase in the triggering current of the thyristor and its voltage drop in the conductive state. Therefore, increasing the hold current decreases the capability to be triggered and to withstand high current flows.

Since the amplifying thyristor T2 must be sensitive enough to permit triggering at a low control current of the amplifying-gate thyristor, it unavoidably has a relatively low hold current. Thus, to manufacture an amplifying-gate thyristor with a relatively high hold current, the circuit designer uses various conventional techniques so that, once the thyristor T2 triggers the thyristor T1, only thyristor T1 remains conductive. Once thyristor T1 is triggered, it is sufficiently conductive with respect to thyristor T2 that the current in thyristor T2 becomes lower than its low hold current and it turns off.

Thus, as illustrated in FIG. 1A, once the current is established in thyristor T, the whole anode current I will flow through the main thyristor T1, and the current in the amplifying thyristor T2 will be zero. Accordingly, at the turn off, only the high hold current of thyristor T1 intervenes since thyristor T2 is already turned off.

As indicated above, for a thyristor with a given size, the possibility of increasing the value of the hold current is limited in order not to impair the other features of the thyristor.

SUMMARY OF THE INVENTION

Thus, an object of the present invention is to provide an amplifying-gate thyristor that can be turned off while the current flowing therethrough is higher than for a conventional amplifying-gate thyristor having substantially the same structure.

Another object of the invention is to provide such an amplifying-gate thyristor that can be manufactured without technological modifications with respect to a conventional amplifying-gate thyristor.

These objects are achieved according to the invention with an amplifying-gate thyristor in which the amplifying thyristor is of the gate turnoff (GTO)-type and in which the main thyristor and the amplifying thyristor are disposed so that the amplifying thyristor remains in the conductive state while the main thyristor is conductive.

According to an embodiment of the invention, the thyristor is implemented as a monolithic component in which the main thyristor and the amplifying thyristor are vertically disposed in a semiconductor structure.

According to an embodiment of the invention, the main thyristor and the amplifying thyristor have distinct emitter and/or cathode doping levels.

According to an embodiment of the invention, the current in the amplifying thyristor has a predetermined value when the current in the main thyristor is close to the hold current of the latter, and there are provided means for detecting the moment when the whole current in the thyristor drops to a value close to the sum of the hold current and of the current having a predetermined value, and means for applying a negative gate voltage to the GTO thyristor once this detection has been achieved.

A structure according to the invention advantageously applies to the implementation of switches associated with fluorescent lamp ballasts fed by a rectified a.c. current. Such switches must be controlled to be turned off while the current flowing therethrough has a relatively high value so as to cause an abrupt interruption in the supply of an inductive load and the occurrence of an overvoltage.

In such an application, the thyristor according to the invention is connected to the d.c. terminals of a rectifying bridge, in series with a series of diodes, with a resistor disposed between the gate and the anode, and a controlled switch connected between the gate of the thyristor and the cathode of the last diode of the series of diodes. The value of the sum of the hold current of the main thyristor and of the current in the amplifying thyristor is greater than the current in the thyristor during the preheating phase of the fluorescent lamp.

The foregoing and other objects, features, aspects and advantages of the invention will become apparent from the following detailed description of the present invention when taken in conjunction with the accompanying drawings.

BRIEF DESCRIPTION OF DRAWINGS

FIGS. 1A and 1B, above described, respectively illustrate a circuit diagram and wave form graph of a conventional amplifying-gate thyristor;

FIGS. 2A and 2B respectively represent a circuit diagram and wave form graph of an amplifying-gate thyristor according to the present invention;

DETAILED DESCRIPTION

As shown in FIG. 2A, the present invention provides, in an amplifying-gate thyristor T. The amplifying thyristor T3 is a GTO-type thyristor. The structures of the thyristors T1 and T3 are selected so that, when the main thyristor T1 is in the conductive state, the voltage across its terminals remains sufficient so that the current in the GTO thyristor T3 remains higher than the hold current iH of the GTO thyristor T3. Thus, when the component is in the conductive state, the current I in its anode is partitioned into a current I1 in the main thyristor T1 and a current I2 in the GTO amplifying thyristor T3. Of course, current I1 is higher than current I2 when the main thyristor T1 is fully conductive.

The hold current of the amplifying-gate thyristor T, as a whole, corresponds to the hold current iH of the GTO thyristor T3. As previously explained, the hold current iH corresponds to a low value, substantially lower than the value of the hold current IH of the main thyristor T1.

When the main current I in the amplifying-gate thyristor T according to the present invention decreases and reaches a value such that the current I1 in the main thyristor T1 is close to its hold current IH, a current $I2_0$ flows through the GTO thyristor T3. This current $I2_0$ is more than the hold current iH for the GTO thyristor T3. Inherently, a GTO thyristor can be interrupted when a voltage lower than the voltage on its cathode is imposed to its gate. The voltage at terminal G should be lower than the voltage at terminal K by a value substantially corresponding to two to three forward voltage drops of a diode (1.4 to 2.1 volts). Then, the current $I2_0$ can be absorbed by the gate circuit and the GTO thyristor T3 will turn off. Simultaneously, the thyristor T1 will conduct a current slightly lower than its hold current IH and will turn off. Thus, a component that turns off for an overall current value equal to $IH+I2_0$ is obtained.

Accordingly, with the provision of a simple turn off control circuit for the gate of the GTO thyristor T3, a component is obtained whose apparent hold current is $IH+I2_0$. This hold current is higher than the hold current of a thyristor having the same general characteristics, in which the amplifying thyristor is a conventional thyristor and not a GTO thyristor.

Figure 3:
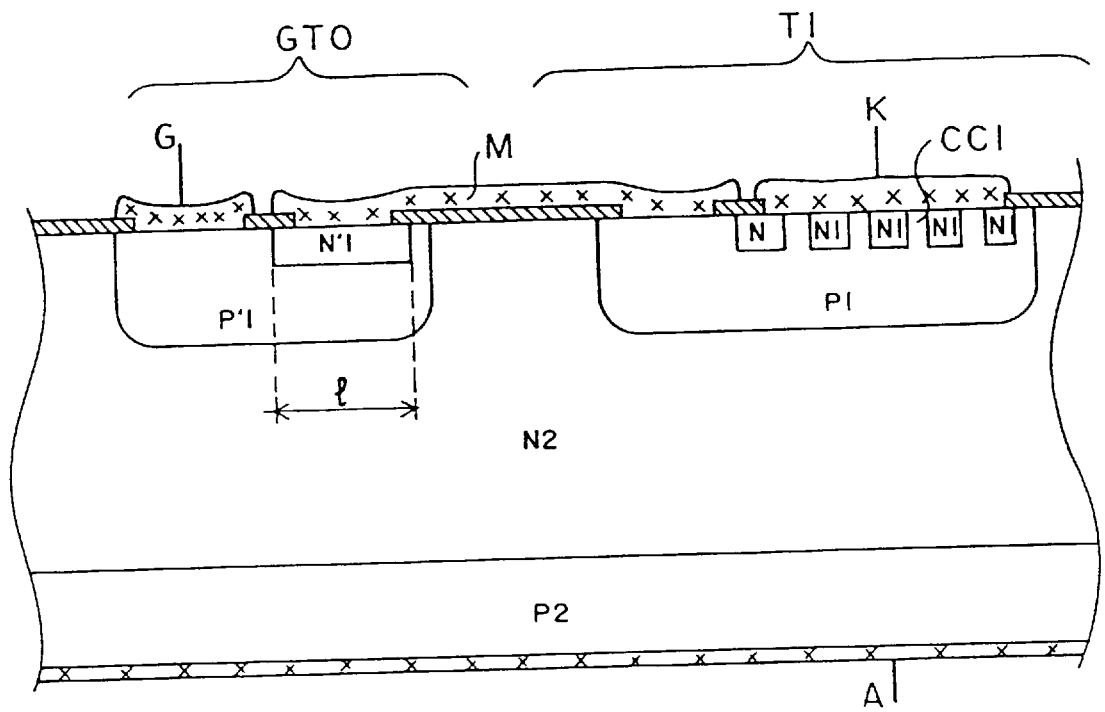
FIG. 3 is a cross-sectional view of a first embodiment of an amplifying-gate thyristor according to the present invention.

FIG. 3 is a schematic cross-sectional view of a monolithic implementation of an amplifying-gate thyristor according to the present invention.

The main thyristor T1 is vertically disposed in a semiconductor wafer and includes successive layers N1, P1, N2, and P2. Region N1 is formed on the upper surface of the wafer and corresponds to the cathode. Region P1, usually referred to as an emitter region, constitutes a well formed in a substrate N2. The anode layer P2 corresponds to a rear surface layer. Conventionally, region N1 is interrupted so that portions of layer P1 locally extend up to the upper surface of the component in holes (commonly referred to as "emitter shorts") CC1 formed in the region N1. The upper surface of layer N1 and of the emitter shorts is coated with a metallization K. The rear surface is coated with a metallization A.

The GTO amplifying thyristor is formed by regions N'1, P'1, N2, and P2. Regions N2 and P2 are the same as those mentioned above, and region P'1 is a well formed like well P1 in the substrate N2. Region N'1 forms the cathode of the amplifying thyristor, and region P'1 forms its emitter or gate area. The anode metallization A of the main thyristor also forms the anode metallization of the amplifying thyristor. Region N'1 is connected through a floating metallization M to the upper surface of region P1, and the upper surface of region P'1 is coated with a metallization G that forms the component's gate.

To allow the amplifying thyristor to have the characteristics of a GTO thyristor, the region N'1 formed in well P'1 of this GTO thyristor must have a specific configuration. Suitable configurations are known. It is essential that the width 1 of the cathode N'1, that is, the distance between the cathode point disposed further away from the gate metallization and the cathode point disposed nearest to the gate metallization, be small. In order to extract current through the gate metallization G, and to stop current flowing through region N'1, the current flowing from the farthest end to the nearest end of width 1 should not generate a voltage drop beneath the cathode higher than the forward voltage drop of a diode.

Of course, various modifications can be made to the structure according to the invention such as usually made for the construction of GTO thyristors and amplifying-gate thyristors.

Figure 4:
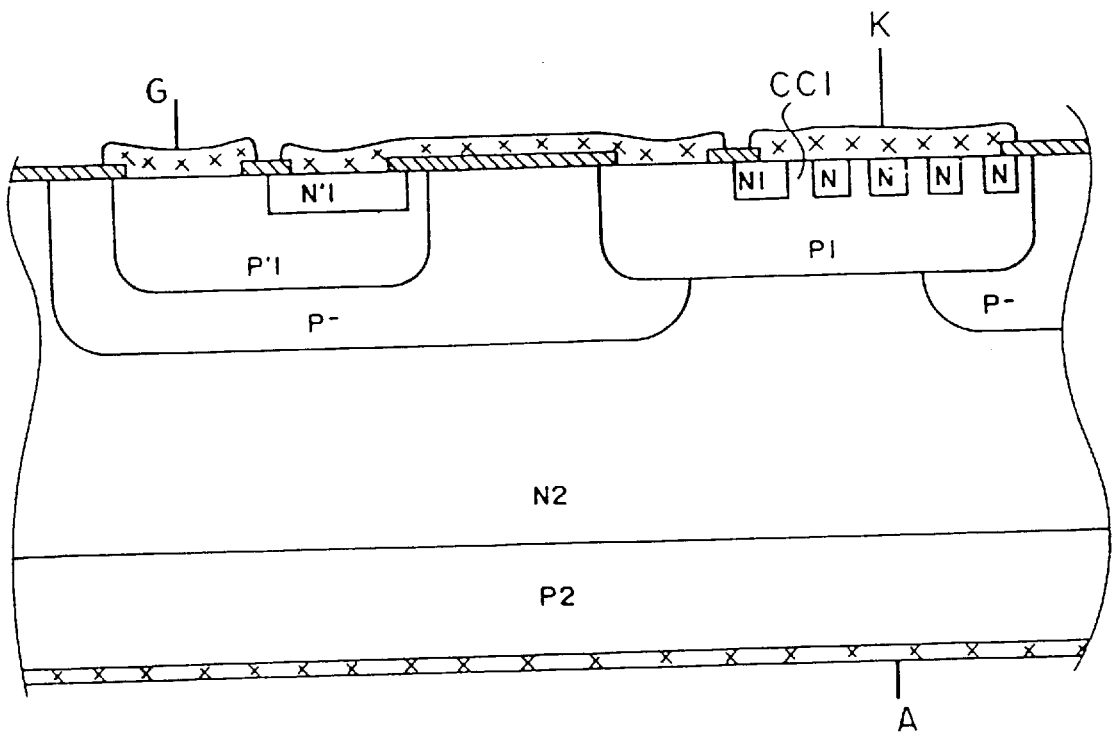
FIG. 4 is a cross-sectional view of a second embodiment of an amplifying-gate thyristor according to the present invention.

Such a modification is illustrated in FIG. 4 in which the same reference characters as in FIG. 3 designate the same layers, but in which a P⁻ region entirely surrounding the well P'1 and the periphery of well P1 is added. As is known, such a structure provides a thyristor capable of withstanding higher voltages. For example, if the thyristor of FIG. 3 is designed to withstand a voltage of approximately 700 volts, the thyristor of FIG. 4 will be able to withstand a voltage of approximately 1500 volts.

Figure 5:
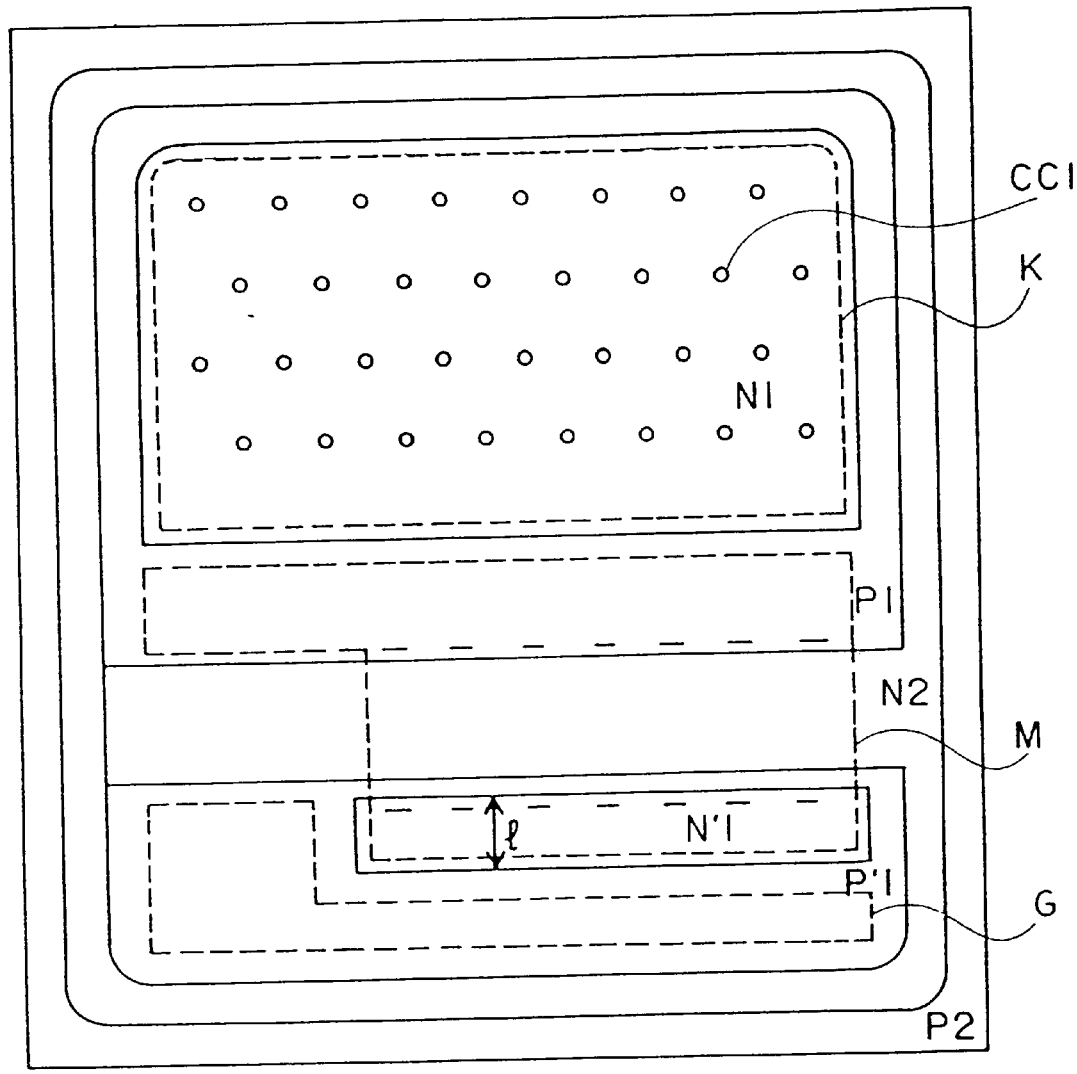
FIG. 5 is a schematic top view of an embodiment of an amplifying-gate thyristor according to the invention.

FIG. 5 is an exemplary top view of another amplifying-gate thyristor according to the invention. This top view does not necessarily correspond to the cross-sectional view of FIG. 3; however, the same layers are labeled with same references. FIG. 5 represents a well-type thyristor, that is, a thyristor in which the periphery is occupied by a region P, referenced P2 since it contacts the layer P2 of the rear surface. In the substrate N2, that appears inside the peripheral region P2, the two wells P1 and P'1 and, inside each well, the cathode regions N1 and N'1, are formed. The outlines of metallizations K, G and M are drawn in dotted lines. Of course, the portion of metallization M that extends over region N2 is isolated by an insulating layer, usually a silicon oxide layer, from the surface of layer N2. This and other insulating layers are symbolically represented by cross-hatched thin layers in FIGS. 3 and 4.

Figure 6:
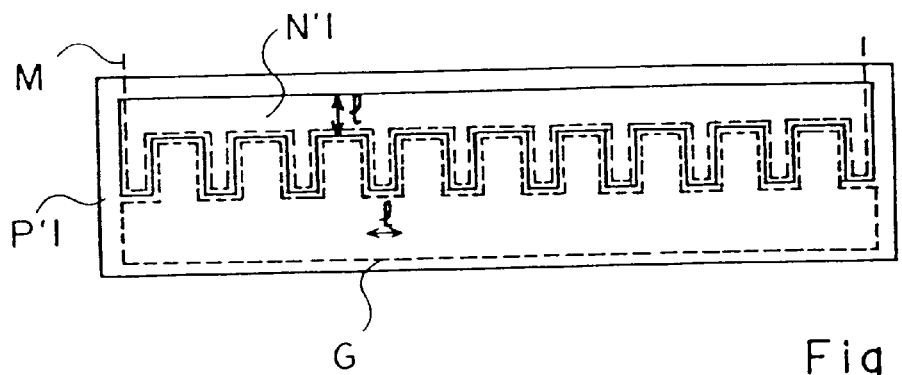
FIG. 6 illustrates an alternative embodiment of the gate area of the GTO amplifying thyristor usable in the structure of FIG. 5.

FIG. 6 represents an alternative embodiment of the gate and cathode regions of the amplifying-gate GTO thyristor. In this alternative embodiment, the edges of the cathode and gate regions are interdigitized.

As represented in FIG. 5, conventionally, the cathode of the amplifying GTO thyristor does not include emitter shorting holes whereas the cathode of the main thyristor includes emitter shorting holes CC1. The distribution and density of these emitter shorting holes are selected so that the desired characteristics of the main thyristor are achieved. More particularly, to impart a relatively high hold current to the main thyristor, a relatively high density of the emitter's shorting holes is used. In contrast, the amplifying thyristor is free from emitter shorting holes in order to have a high sensitivity so that the GTO thyristor of the circuit can be turned on by a low gate current.

Those skilled in the art will be able to devise means to make sure that the on-resistance of the main thyristor is sufficient so that, when the main thyristor is in the conductive state, the amplifying thyristor does not turn off. In particular, those skilled in the art will be able to select the distribution of the emitter shorting holes, the doping levels of regions N1 and P1, the thickness of region P1, and the life duration of the minority carriers in region P1 or in a portion of region N2.

In an embodiment of the present invention corresponding to FIG. 4, the surface concentrations of dopants, CS, in the various layers have the following values:

$CS_{N1} = CS_{N'1} = 10^{20}$ atoms/cm$^3$, $CS_{P2} = CS_{P1} = CS_{P'1} = 10^{18}$ atoms/cm$^3$, $CS_{P-} = 10^{15}$ atoms/cm$^3$, and the resistance of layer N2 is within a range of 30–60 Ω.cm depending on the desired voltage.

By way of example, in an embodiment of the present invention where the component is similar to the abovementioned component TN22, values for $I_H$ and $I2_0$ of 300 and 200 mA, respectively, have been obtained, which provides an amplifying-gate thyristor whose equivalent hold current is approximately 500 mA instead of 200 mA for the conventional component. $I2_0$ can be increased by increasing the negative voltage applied to the component's gate. For example, by applying −3 volts instead of −2 volts between the gate and the cathode, $I2_0$ reaches 300 mA instead of 200 mA. However, the need for a simple control and the power dissipated in the gate circuit are a limitation to this increase.

As indicated above, the component according to the present invention applies to the switches associated with fluorescent lamp ballasts. In particular, the component according to the present invention can be substituted for the component TN22 in this application.

Figure 7:
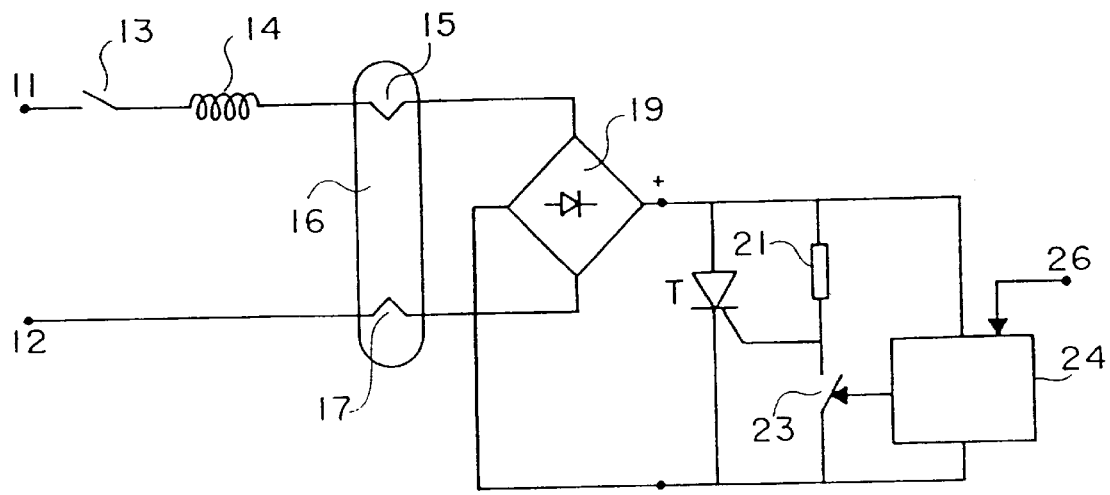
FIG. 7 shows a known circuit using the thyristor of FIG. 1A.

FIG. 7 shows a control circuit of a fluorescent lamp such as illustrated in the TN22 preliminary data sheet issued on November 1991 by SGS-Thomson Microelectronics. An a.c. power supply, for example 220 V, is applied between terminals 11 and 12. Terminal 11 is connected through a powering on switch 13 and an inductive ballast 14 to a first terminal of a heating resistor 15 of a fluorescent tube 16. Terminal 12 is connected to the first terminal of a second heating resistor 17 of the tube 16. The second terminals of the heating resistors 15 and 17 are connected to the a.c. inputs of a rectifying bridge 19. The outputs (+) and (−) of the rectifying bridge 19 are respectively connected to the anode and to the cathode of a thyristor T, such as thyristor TN22, that corresponds to the thyristor of FIG. 1A. The thyristor gate is connected to terminal (+) through a resistor 21 and to terminal (−) through a controlled switch 23. A control circuit 24 of switch 23 is also fed by terminals (+) and (−) and receives at a terminal 26 a control signal determining the switching off or switching on of switch 23. Initially, switch 23 is switched off. When switch 13 is switched on, the thyristor T becomes conductive. Then, a heating current flows through resistors 15 and 17 of tube 16. After a preheating period, switch 23 is switched on by the control circuit 24. The current in thyristor T drops and it switches off as soon as the current that it conducts is below its hold current IH. The switching of the thyristor T causes the inductive ballast 14 to generate a triggering pulse. The amplitude of the pulse generated by the inductive ballast 14 depends upon the value of the hold current of thyristor T. The higher the hold current, the higher the pulse. That is why high hold currents are desired.

Figure 8:
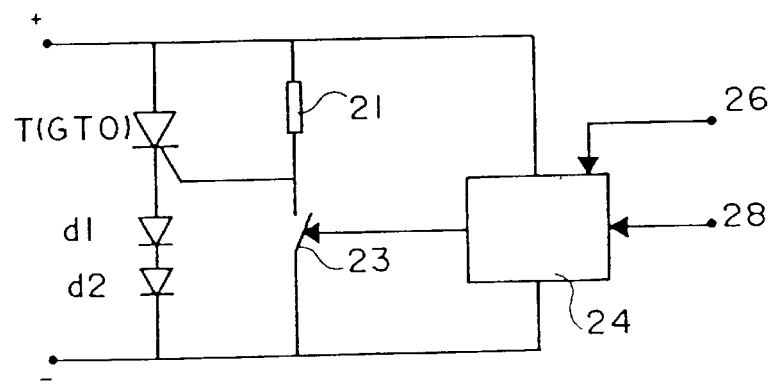
FIG. 8 shows a portion of the circuit of FIG. 7 using a thyristor according to the present invention.

As shown in FIG. 8, it is proposed to use the thyristor T(GTO) according to the present invention instead of the conventional thyristor T in FIG. 7. The circuit is substantially identical to the circuit of FIG. 7 except for the fact that a plurality of diodes, d1, d2, is disposed in series with the thyristor T(GTO) and that the control circuit 24 includes an additional enabling input 28. The enabling input 28 is active and the control circuit 24 turns off switch 23, only when the current in the thyristor T(GTO) is lower than or equal to the hold current IH+$I2_0$. Then, when switch 23 is turned on, the cathode of the thyristor T(GTO) is biased positively with respect to the gate by the sum of the forward voltage drops of each diode d1, d2 of the series of diodes. This value depends upon the number of diodes that are used.

Thus, the implementation of the invention requires few modifications with respect to a conventional circuit, namely, the addition of diodes d1 and d2 and the provision of a current detecting circuit.

Preferably, the component according to the present invention will be inserted in a circuit such that, during the preheating period, the current in the thyristor T(GTO) cannot exceed value IH+$I2_0$. Then, a current detecting circuit is unnecessary.

Of course, various modifications can be made to the above disclosed preferred embodiments; for example, the amplified gate can be in a central area of the component.

Having thus described one particular embodiment of the invention, various alterations, modifications, and improvements will readily occur to those skilled in the art. Such alterations, modifications, and improvements are intended to be part of this disclosure, and are intended to be within the spirit and scope of the invention. Accordingly, the foregoing description is by way of example only and is not intended to be limiting. The invention is limited only as defined in the following claims and the equivalents thereto.

What is claimed is:

1. An amplifying-gate thyristor comprising:

a main thyristor, an amplifying thyristor of the gate turnoff type, wherein the amplifying thyristor remains in a conductive state while the main thyristor is conductive; and gate voltage means for applying a negative gate voltage to the amplifying thyristor when current through said main thyristor is near a hold current of said main thyristor.

2. The amplifying-gate thyristor of claim 1, wherein the main thyristor and the amplifying thyristor are vertically disposed in a semiconductor structure to form a monolithic component.

3. A method for operating a amplifying-gate thyristor having a main thyristor and an amplifying thyristor, said method comprising the steps of:

making said main thyristor and said amplifying thyristor conductive;

maintaining said amplifying thyristor in a conductive state while said main thyristor is in a conductive state;

turning off said amplifying thyristor when current through said main thyristor is near a hold current for said main thyristor.

4. The method of claim 3, wherein said turning off step includes applying a negative gate voltage to said amplifying thyristor.

5. The method of claim 3, further comprising the step of monitoring current through said amplifying-gate thyristor to determine when current through said main thyristor is near a hold current.

* * * * *

UNITED STATES PATENT AND TRADEMARK OFFICE
CERTIFICATE OF CORRECTION

PATENT NO. : 5,998,812
DATED : December 7, 1999
INVENTOR(S) : Eric Bernier and Denis Berthiot It is certified that error appears in the above-identified patent and that said Letters Patent is hereby corrected as shown below:

On the title page Items [30] and [75] should read as indicated

Foreign Application Priority Data

Aug. 6, 1993   [FR]   France ..............................93 09929

Inventors:  Eric Bernier, Mettray, France; Denis Berthiot Tours, France

Signed and Sealed this

Thirtieth Day of May, 2000

Attest:

Q. TODD DICKINSON

*Attesting Officer*         *Director of Patents and Trademarks*